(12) United States Patent
Zur

(10) Patent No.: US 6,191,582 B1
(45) Date of Patent: Feb. 20, 2001

(54) EDDY CURRENT COMPENSATION

(75) Inventor: Yuval Zur, Haifa (IL)

(73) Assignee: General Electric Company, Schenectady, NY (US)

(*) Notice: Under 35 U.S.C. 154(b), the term of this patent shall be extended for 0 days.

(21) Appl. No.: 09/358,616

(22) Filed: Jul. 21, 1999

(51) Int. Cl.[7] ...................................................... G01V 3/00
(52) U.S. Cl. ............................................ 324/307; 324/309
(58) Field of Search .................................. 324/307, 309, 324/322, 300

(56) References Cited

U.S. PATENT DOCUMENTS

| | | | |
|---|---|---|---|
| 4,698,591 | 10/1987 | Glover | 324/307 |
| 4,928,063 | * 5/1990 | Lampman et al. | 324/307 |
| 5,200,701 | * 4/1993 | Siebold et al. | 324/309 |

OTHER PUBLICATIONS

Gach, H. Michael et al.; "A Programmable Pre–emphasis System"; MRM 40:427–431; 1998.

Van Vaals, J.J. and Bergman, A. H.; "Optimization of Eddy–Current Compensation"; Journal of Magnetic Resonance 90; pp. 52–70; 1990.

Jehenson, P. et al.; "Analytical Method for the Compensation of Eddy–Current Effects Induced by Pulsed Magnetic Field Gradients in NMR Systems"; Journal of Magnetic Resonance 90; pp. 264–278; 1990.

Zur, Yuval and Stokar, Saul; "An Algorithm for Eddy Currents Symmetrization and Compensation"; Magnetic Resonance in Medicine 35:252–260; Feb. 1996.

Morich, Michael A.; "Exact Temporal Eddy Current Compensation in Magnetic Resonance Imaging Systems"; IEEE Transactions on Medical Imaging, vol. 7, No. 3; Sep. 1988.

* cited by examiner

*Primary Examiner*—Christine K. Oda
*Assistant Examiner*—Brij B. Shrivastav
(74) *Attorney, Agent, or Firm*—Cowan, Liebowitz & Latman, P.C.; William H. Dippert (57) ABSTRACT

A method of compensating for an eddy field according to measurements of the field. The method includes fitting the measurements of the field to a plurality of candidate models of the field. A stability value indicative of the stability of the fitted model to changes, is assigned to each of the fitted candidate models. A model is selected from the candidate models responsive to the stability values of the candidate models and the eddy fields are compensated responsive to the selected model.

33 Claims, 3 Drawing Sheets

EDDY CURRENT COMPENSATION

FIELD OF THE INVENTION

The present invention relates to magnetic resonance imaging (MRI) and in particular to compensation for parasitic fields caused by eddy currents.

BACKGROUND OF THE INVENTION

Time dependent magnetic field gradients are employed in most magnetic resonance imaging (MRI) and localized spectroscopy techniques. In an MRI technique, magnetic fields are rapidly switched according to a desired pattern. In order to receive good results, the generated magnetic fields must accurately follow the desired pattern. Substantially all MRI systems include conductive materials which form eddy currents responsive to the switched magnetic field. These eddy currents induce a time dependent magnetic field, referred to as an eddy field, which distorts the generated magnetic fields. Generally, the generated magnetic field includes a constant field $B_0$ and gradient fields in three directions labeled Bx, By and Bz. The gradient fields are generated by passing currents through coils.

One of the methods used to eliminate the effect of the eddy fields, is eddy current pre-compensation. In pre-compensation, the currents used to generate the magnetic fields are changed, such that they create in addition to the magnetic fields which follow the desired pattern, a compensation magnetic field which cancels the eddy fields. Generally, a filter is used to change the currents through the coils such that they create the compensation field in addition to the desired magnetic fields. Typically it is assumed that the eddy-fields may be modeled by a sum of decaying exponents. Measurements of the eddy-field are fit into the model, providing an adjusted model. The fitting involves assigning values to parameters of the model (the amplitudes and time constants of the exponents). Parameters of the filter are then adjusted responsive to the adjusted model.

The induced eddy fields do not necessarily have the same spatial distribution as the fields which induced them. Eddy fields which have the same spatial distribution as the field which induced them are referred to as diagonal fields while fields in other directions are referred to as non-diagonal fields. Usually, induced eddy fields include both diagonal and non-diagonal fields and the non-diagonal eddy fields are of much smaller magnitudes than the diagonal fields. In pre-compensation, non diagonal fields are compensated by changing the currents in other coils of the system than the coil used to generate the field which induced the eddy fields.

Eddy current pre-compensation is described, for example, in a paper titled "Reduction of pulsed gradient settling time in the superconducting magnet of a magnetic resonance instrument", by Dye J. Jensen, et al., Medical Physics, Vol. 14, September/October 1987, the disclosure of which is incorporated herein by reference. This paper assumes the eddy-field model is a sum of three exponents, and the filter comprises three high pass filters. The paper states that the time constants and amplitudes of the filters are adjusted interactively starting from the longest time constant.

A paper titled "A programmable Pre-emphasis System" by H. M. Gach et al, MRM 40:427–431, 1998, the disclosure of which is incorporated herein by reference, describes using sixteen RC filters with fixed time constants, to compensate for the eddy fields. The eddy fields are measured separately for each time constant and the amplitude coefficients of the filters are adjusted accordingly. The described method is reported to require anywhere between a few hours to days for measuring and compensating the eddy fields.

U.S. Pat. No. 4,698,591 to Glover et al., the disclosure of which is incorporated herein by reference, describes modeling the field by a sum of two or three exponentials. The time constants and amplitudes of the exponentials are determined in a way which minimizes a $\chi^2$ error expression. In order to simplify the exponential fit, some of the stages are performed while keeping the time constants at fixed values such that the fit is linear in the amplitudes of the exponentials. The time constants and amplitudes of the exponents of the model are used to set parameters of respective filters. This patent also describes adjusting initial values of the time constants and amplitudes of the filters using an iterative process. The remaining eddy-field after the correction is measured and the measurements are fit to a new set of exponentials using the previous time constants. The resulting amplitudes are added to the previous amplitudes.

A paper titled "Analytical Method for the Compensation of eddy-currents Effects Induced by Pulsed Magnetic Field Gradients in NMR systems", by P. Jehenson et al., Journal of Magnetic Resonance, 1990, pages 264–278, the disclosure of which is incorporated herein by reference, describes fitting the measurements of an eddy field into a model which takes into account the pre-compensation parameters of the filters. The eddy fields are at first measured and fit into the model while the pre-compensation parameters have zero values. Thereafter, the parameters are determined responsive to the model. The compensated eddy fields are then remeasured and are fit into an improved model which includes the applied values of the parameters of the filters. The improved model is used to reset the parameters of the filters. The paper suggests repeating the procedure to yield improved parameters.

A paper titled "Optimization of eddy-Current Compensation", by J. J. Van Vaals and A. H. Bergman, Journal of Magnetic Resonance 1990, pages 52–70, the disclosure of which is incorporated herein by reference, describes performing a plurality of compensation iterations to correct a first fit to the model. The compensation iterations include performing fine adjustments in the measurement method of the eddy fields.

A paper titled "An Algorithm for eddy Currents Symmetrization and Compensation" by Yuval Zur and Saul Stoker, Magnetic Resonance in Medicine, February 1996, the disclosure of which is incorporated herein by reference, suggests an additional filter to symmetrize the eddy field of a pair of coils before it is compensated by the compensation filter. This paper describes a method of measuring the eddy field and accordingly determining the parameters of the compensation filter. The model in this paper includes a sum of one or more exponentials. Due to noise and other errors the process is not accurate and therefore this paper suggests performing an iterative compensation process. However, the calculations used in this paper to determine the parameters of the RF filters based on the measurements are unstable and in the presence of noise do not converge or converge to wrong values.

SUMMARY OF THE INVENTION

One object of some preferred embodiments of the invention is to provide a method of iteratively calculating values of parameters of a filter used in eddy field compensation, such that the method converges correctly in the presence of noise.

One object of some preferred embodiments of the invention is to provide a method of eddy field compensation which is suitable for eddy fields of large magnitude, for example, in systems without shielding.

One aspect of some preferred embodiments of the present invention relates to a method of eddy field compensation in which the measurements of the eddy field are fit into a model in a relatively stable manner. Parameters of an eddy field correction filter are set according to the adjusted model. In addition to having the adjusted model fit relatively closely to the measurements of the eddy field, the adjusted model is required to adhere to a stability requirement. Thus, it is possible to perform small adjustments of the parameters of the adjusted stable model responsive to further measurements of the eddy fields.

In some preferred embodiments of the present invention, a chosen adjusted model is selected from a group of adjusted candidate models. Preferably, the measurements of the eddy field are fit into a plurality of candidate models by adjusting the parameters of the models. The group of candidate models preferably includes sums of exponential elements, each candidate having a different number of elements. Preferably, the group of candidate models includes candidates with between one to a predetermined maximal number of exponential elements.

Each adjusted candidate is preferably assigned an error value which represents the similarity between the adjusted candidate model and the measurements. In addition, each adjusted model is preferably assigned a stability value which represents the stability of the adjusted model. The chosen adjusted model is preferably selected based on both the error value and the stability value. The chosen adjusted model is preferably the adjusted candidate model with the lowest error value among those adjusted candidates which have a stability value beneath a predetermined level. Alternatively, the chosen adjusted model is selected according to a different function of the stability value and/or the error value.

Preferably, the stability value is indicative of the sensitivity of the adjusted model to small changes in the values of its parameters. In a preferred embodiment of the present invention, the stability value comprises a statistical measure of the probability that the values of the parameters of the adjusted candidate are a likely match to the measurements of the eddy field. An unlikely match is usually unstable.

Preferably, the stability value comprises a function, preferably a sum or maximum, of stability criterions determined for each of the parameters, i.e., time constants and amplitudes, of the exponentials in the adjusted candidate models. Alternatively, the stability value comprises any other suitable function of the stability criterions of the parameters. Preferably, the function gives equal weight to the stability criterions of the parameters of the adjusted candidate. Alternatively, the function gives different weight to the stability criterions according to the stability requirements of the different parameters. In a preferred embodiment of the present invention, the stability criterions comprise variances of the standard errors associated with the parameters.

Preferably, the parameters of the filter are corrected by iteratively measuring the residue eddy field and changing the filter parameters responsive to the measurements. Preferably, the number of exponential elements in the chosen model (and hence in the filter) is not changed. For each filter parameter a difference parameter is defined which is added to the filter parameter in order to adjust the parameter. The residue eddy field is fitted, using a linear fit, to a residue-model which is a linear function of the difference parameters. In some preferred embodiments of the present invention, different residue-models are used for diagonal and non-diagonal eddy fields.

Preferably, the residue models are determined by taking the partial derivatives of the models and creating a model which is dependent on the difference parameters. In one aspect of some preferred embodiments of the present invention, generating the residue-models is performed without using simplifications and/or neglecting insignificant elements.

Linear fit methods are simpler, accurate and fast relative to non-linear fitting methods. Unlike non-linear fitting methods in which error minimization is performed iteratively, linear fit methods allow minimization by solving an equation set. Therefore, although non-linear models may have a simpler appearance, linear models provide simpler calculations and faster convergence.

An aspect of some preferred embodiments of the invention relates to performing the linear fit of the measurements of the residue field into the residue-model in a manner which stabilizes the linear fit. Preferably, when the residue-model includes elements of opposite signs the fitting is performed by separately setting each of the parameters. Preferably, a first difference parameter is determined to best fit the measurements while the rest of the difference parameters are set to zero. The first parameter is corrected using its respective difference parameter and then a second difference parameter is set while the rest of the difference parameters are kept constant. This process is preferably repeated a few times for each of the parameters until a best fit to the measurements of the residue field is achieved.

Alternatively or additionally, some or all of the difference parameters with elements of common signs are determined simultaneously.

There is therefore provided in accordance with a preferred embodiment of the present invention, a method of compensating for an eddy field according to measurements of the field, including fitting the measurements of the field to a plurality of candidate models of the field, assigning a stability value indicative of the stability of the fitted model to changes, to each of the fitted candidate models, selecting a model from the candidate models responsive to the stability values of the candidate models, and compensating for the eddy field responsive to the selected model.

Preferably, the method includes determining for each of the candidate models an error criterion representative of a similarity between the fitted candidate model and the measurements of the eddy field, and selecting the model includes selecting the model responsive to the error criterions of the candidate models.

Preferably, selecting the model includes selecting from those candidate models which have a stability value which adheres to a predetermined rule. Further preferably, selecting the model includes selecting from those candidate models which have a stability value below a predetermined value. Preferably, selecting the model includes selecting the candidate model with a lowest error criterion from those candidate models which have a stability value which adheres to the predetermined rule.

Preferably, fitting the measurements of the field includes fitting the field to a plurality of sums of exponentials with different numbers of exponential elements.

Alternatively or additionally, fitting the measurements of the field includes fitting the field to sums of exponentials having up to three exponential elements.

Preferably, fitting the measurements of the field includes setting parameters of the candidate models so as to minimize an error criterion representative of the difference between the candidate model and the measurements of the field.

Preferably, assigning the stability value includes assigning a value which is a function of an uncertainty in a value of at least one parameter of the model. Further preferably, assigning the stability value includes assigning a value which is a function of a standard deviation of an error in at least one parameter of the model.

Preferably, compensating for the eddy field includes setting parameters of at least one filter for eddy field compensation.

Preferably, the method includes measuring a residue eddy field while compensating for the eddy field, fitting the measurements of the residue field to a residue-model of the residue field, the residue-model being a linear function of differentials related to the filter parameters, and resetting the filter parameters responsive to the fitting of the measurements.

There is further provided in accordance with a preferred embodiment of the present invention, a method of correcting the values of filter parameters of an eddy field compensation filter, including measuring a residue eddy field, the measurements including values of the field and times at which the values were measured, fitting the measurements of the residue field to a model of the residue field, the residue-model being a linear function of differentials related to the filter parameters, the residue-model includes at least one term linearly dependent on a time variable representing the measurement time, and correcting the values of the filter parameters responsive to the values of the differentials from the fitting.

Preferably, the model of the residue field is a function of the filter parameters and of a plurality of model parameters. Further preferably, the model of the residue field includes at least six exponential terms for each possible combination of a model parameter and a filter parameter.

Preferably, the model of the residue field includes at least fifteen references to model or filter parameters for each possible combination of a model parameter and a filter parameter.

Preferably, the model of the residue field includes for each possible combination of a model parameter and a filter parameter at least three terms which are functions of a time variable representative of the measurement time.

Preferably, the model of the residue field includes a sum of terms, at least one of the terms being linearly dependent on a time variable representative of the measurement time.

Further preferably, at least one of the terms of the model is dependent on a product of the time variable and an exponential of the time variable.

Preferably, the differentials related to the filter parameters include for substantially each filter parameter a respective differential.

Preferably, correcting the values of the filter parameters includes adding the differentials to respective filter parameters.

Alternatively or additionally, correcting the values of the filter parameters includes adding the differentials to respective model parameters and calculating new filter parameters from the model parameters.

Preferably, the residue eddy field includes a diagonal eddy field or a non-diagonal eddy field.

Preferably, fitting the measurements to the residue model includes performing a plurality of adjustment steps in which the measurements are fit to the residue-model by adjusting the values of fewer than all the adjustment parameters.

There is further provided in accordance with a preferred embodiment of the present invention, a method of adjusting filter parameters of an eddy field compensation filter, including measuring a residue eddy field, providing a residue-model for the measurements of the residue field, the residue model being a linear function of a plurality of adjustment parameters, performing a plurality of adjustment steps in which the measurements of the residue-field is fit to the residue-model by adjusting the values of fewer than all the adjustment parameters, and adjusting the filter parameters in the compensation filter responsive to the adjustment parameters. Preferably, the adjustment parameters include differentials to be added to the filter parameters.

Preferably, performing the plurality of adjustment steps includes performing steps in which only one of the adjustment parameters is adjusted.

Preferably, performing the adjustment steps includes performing steps in which in each single step only adjustment parameters which appear in the residue-model with the same sign are adjusted.

Preferably, the residue model is a function of at least one of the filter parameters.

Preferably, the method includes changing the value in the residue model of at least one of the filter parameters, after at least one of the adjustment steps. Preferably, changing the value in the residue model of at least one of the filter parameters, between each two adjustment steps. Alternatively or additionally, the residue model is a function of at least one model parameter of a model used to determine the filter parameters before the adjustment, and the value of the model parameter remains constant during the performing of the plurality of adjustment steps.

BRIEF DESCRIPTION OF FIGURES

The invention will be more clearly understood by reference to the following description of preferred embodiments thereof in conjunction with the figures, in which.

DETAILED DESCRIPTION OF THE PREFERRED EMBODIMENTS

Figure 1:
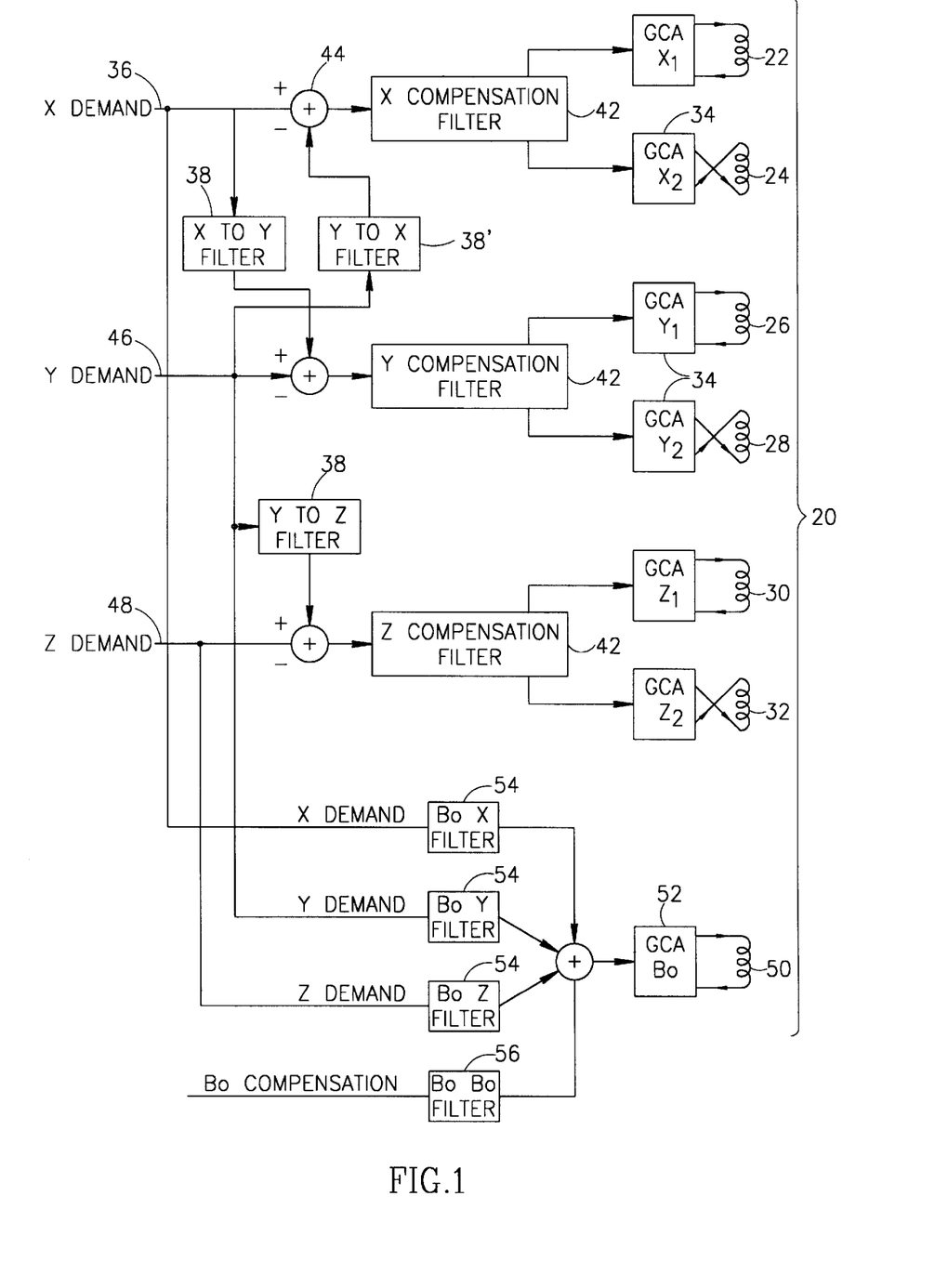
FIG. 1 is a schematic illustration of an MRI gradient coil assembly, in accordance with a preferred embodiment of the invention.

FIG. 1 is a schematic illustration of an MRI gradient coil assembly 20, in accordance with a preferred embodiment of the invention. Coil assembly 20 is preferably part of a medical resonance imaging (MRI) system which includes a strong constant magnet and a plurality of coils for inducing specific magnetic fields. Coil assembly 20 comprises a pair of x-coils 22 and 24, a pair of y-coils 26 and 28, and a pair of z-coils 30 and 32. Each of coils 22, 24, 26, 28, 30 and 32 preferably comprises a respective gradient coil amplifier (GCA) 34 which drives current through the coil. Amplifiers 34 of x-coils 22 and 24 receive an input current, referred to as an x-demand, along an input line 36. The current through each of the pairs of coils, e.g., coils 22 and 24, is equal with opposite directions. The currents through coils 22 and 24 generate a magnetic field which follows a desired pattern. In order to compensate for eddy-currents formed responsive to the magnetic field generated by x-coils 22 and 24, the x-demand directed to coils 22 and 24 is preferably passed through a compensation filter 42. The parameters of filter 42 are set such that the combined field generated by x-coils 22 and 24 and the eddy-currents induced by the x-coils in the x direction follow the x-demand.

Preferably, similarly y- and z- demands are provided through respective input lines 46 and 48 for y-coils 26 and 28, and z-coils 30 and 32. Further preferably, similar compensation filters 42 are used to compensate for the diagonal eddy current elements, i.e., eddy currents which generate a magnetic field in the direction of a magnetic field which induced the field.

Preferably, in addition to the correction current to x-coils 22 and 24 from filter 42, which is dependent on the x-demand, the x-coils receive currents, from one or more filters 38, which depend on the y- and z- demands. These additional currents compensate for non-diagonal eddy currents. Preferably, an adder 44 combines the current from filter 38 and from the x-demand. In an alternative embodiment, adder 44 is at the output of filter 42 rather than at the input of filter 42.

Preferably, assembly 20 includes a shim coil 50 which compensates for non-diagonal eddy fields in the direction of $B_0$. An amplifier 52 receives signals originating from the x- y- and z-demands passed through respective filters 54. In a preferred embodiment of the present invention, assembly 20 also includes a compensation filter 56 which compensates for diagonal eddy fields caused by the current through shim coil 50.

Figure 2:
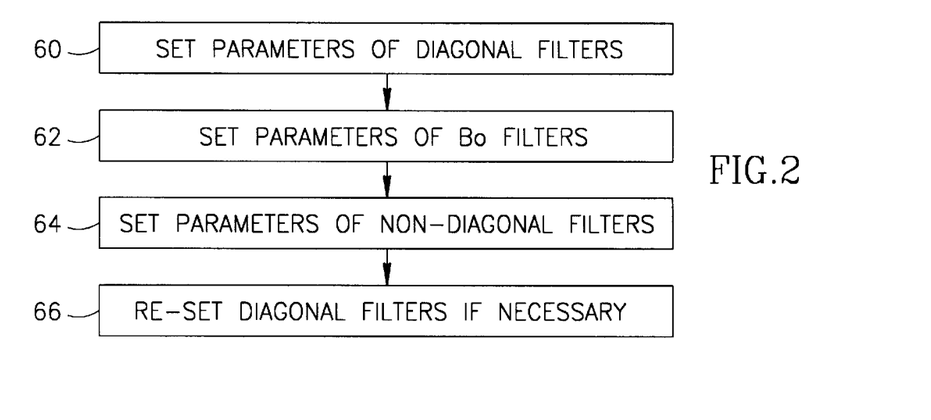
FIG. 2 is a flow chart of the actions performed in setting the parameters of the filters of the assembly of FIG. 1, in accordance with a preferred embodiment of the present invention.

FIG. 2 is a flow chart of the actions performed in setting the parameters of the filters of assembly 20, in accordance with a preferred embodiment of the present invention. Preferably, in a first stage the parameters of filters 42 and 56 which compensate for diagonal eddy fields are set (60). The setting is preferably performed as described hereinbelow with reference to FIG. 3. Thereafter, the parameters of filters 54 are set (62). Afterwards, the spatially dependent non-diagonal eddy fields are measured and the parameters of filters 38 are set (64) so as to compensate for these eddy fields. In a preferred embodiment of the present invention, the parameters of filters 42 and 54 are re-set (66) after the setting of filters 38.

Alternatively or additionally, the parameters of the filters are set in any other suitable order. Further additionally or alternatively, additional iterations of re-setting the parameters of the filters are performed. Such iterations may be performed until, for example, a satisfactory low level of uncompensated eddy fields is achieved.

Figure 3:
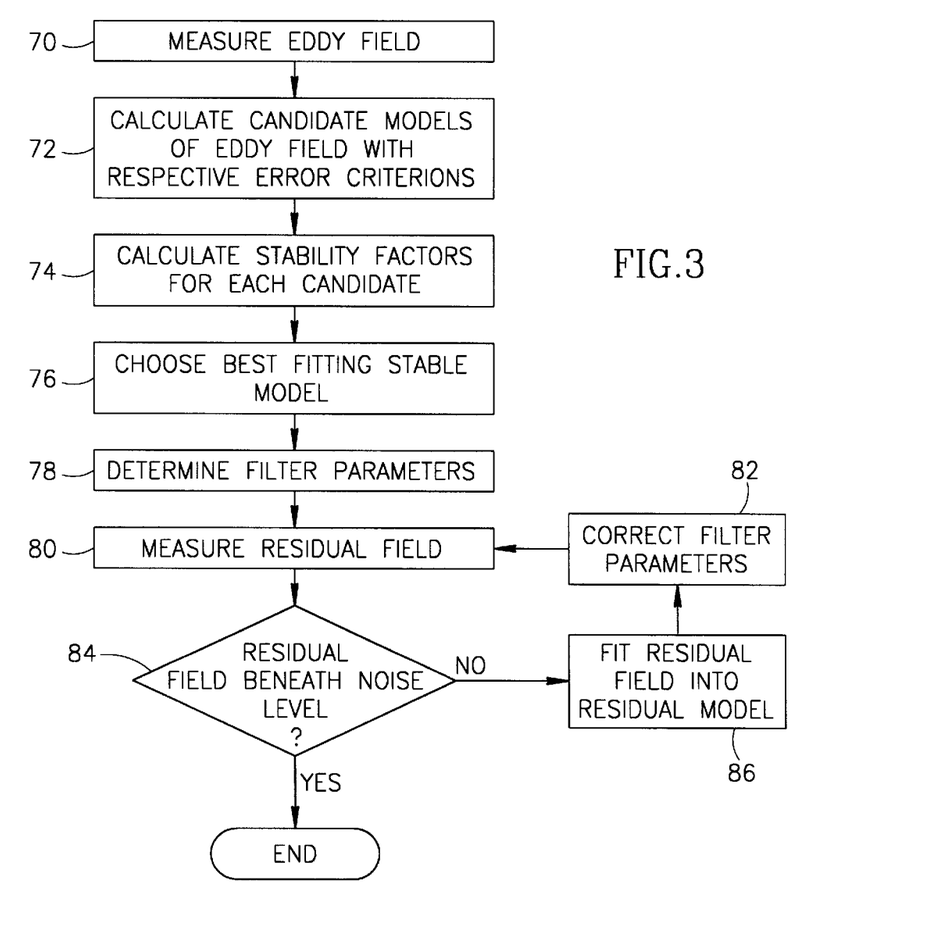
FIG. 3 is a flow chart of the actions performed in setting the parameters of a compensation filter, in accordance with a preferred embodiment of the present invention.

FIG. 3 is a flow chart of the actions performed in setting the parameters of a filter 42 for compensating for diagonal eddy fields, for example of x-coils 22 and 24, in accordance with a preferred embodiment of the present invention. A constant signal of a time period T is applied to the x-demand and the field generated responsive thereto is measured as a function of time. In addition, the steady state value of the field is preferably measured (70) for normalization. The measurements are preferably performed as described in any of the articles mentioned in the background of the present application, or as described hereinbelow. Preferably, the eddy field B(t) with the spatial distribution of the field of the x-coils is determined from the measurements, for example, by performing a polynomial fit in x.

Using an exponential fitting method the eddy field B(t) in the x-direction is fit into a model which is known to represent eddy fields. In a preferred embodiment of the present invention, the model is formed of a sum of exponents as described by the following equation:

$$f(t) = \sum_{j=1}^{N} \beta_j e^{-\omega_j t}[1 - e^{-\omega_j T}] \quad (1)$$

The exponential fitting includes determination of the number of exponential elements N, the amplitudes $\beta_j$ and the frequencies $\omega_j$ (which are inverses of respective time constants of the decaying exponentials). Alternatively, the measurement of the field is performed in any other suitable manner and the model of the field is chosen accordingly.

Preferably, the eddy field measurements are fitted (72) separately to a plurality of different candidate models. In a preferred embodiment of the invention, the plurality of candidate models comprise sums of exponential terms with different numbers of terms in the different candidates. That is, the different candidates are described by equation (1) with different values of N. Preferably, the candidate models have values of N between one and a predetermined maximal value which is preferably between three and five, most preferably, three. Fitting into candidate models with more than three exponential terms requires additional computation complexity and usually results in unstable adjusted models.

For each candidate model, the exponential fitting forms an adjusted model by determining the amplitudes $\beta_j$ and the frequencies $\omega_j$ which best fit the measurements, i.e., which minimize an error criterion. The value of the minimized error criterion for each candidate model is preferably used in selecting a best candidate model, as described hereinbelow. In a preferred embodiment of the present invention, the error criterion comprises the sum-of-squares error criterion for the measurement points $t_i$:

$$\chi^2 = \sum_i [B(t_i) - f(t_i)]^2 \quad (2)$$

Preferably, the exponential fitting is performed using a Levenberg-Marquardt method as described in chapter 15 of "Numerical Recipes in C", by W. H. Press et al., second edition, 1992, the disclosure of which is incorporated herein by reference. Alternatively, other suitable exponential fitting methods may be used.

Each adjusted candidate model is preferably assigned (74) a stability value which represents the stability of the adjusted model when small changes are performed in its parameters, i.e., amplitudes $\beta_j$ and frequencies $\omega_j$. Preferably, the stability value is a function, preferably a sum or maximum, of stability factors assigned to each of the parameters of the candidate model.

In a preferred embodiment of the present invention, the stability value is based on a measure of the uncertainty in the parameters of the model. Preferably, the stability value is represented by a statistical measure of goodness-of-fit of the adjusted model as described, for example, in chapter 15 of "Numerical Recipes in C", cited above. The stability factors of the parameters are preferably dimensionless standard deviations of the errors in the parameters.

A method of calculating the stability factors is now described. Preferably, during performing the fit of the measured data into a model, a covariance matrix $[c_{ij}]$ is received. The elements $c_{jj}$ on the diagonal of the covariance matrix represent the ratio between the root mean square (RMS)

error of the parameters and the RMS of the errors in the measured data ($\sigma^2$). The standard error of the measured data ($\sigma$) is preferably measured directly. In a preferred embodiment of the present invention, the measurement of the data is continued after the eddy currents have substantially entirely faded and the standard error ($\sigma$) is determined from these measurements. Alternatively, the standard error ($\sigma$) is determined from comparison of the measurements to the fitted model, for example, using equation (15.1.6) in "Numerical Recipes in C", cited above. The standard deviations of the errors in the parameters are preferably received by taking the square root of the product of the diagonal elements of the covariance matrix and the RMS of the errors in the measured data ($\sigma^2$). In order to receive a dimensionless value, the standard deviations of the parameters are preferably divided by the values of their respective parameters. Hence, the dimensionless standard deviations of the parameters are equal to $\sqrt{c_{jj}\sigma^2}$/parameter.

Preferably, an adjusted model is chosen (76) based on both the error criterions and the stability values of the adjusted candidate models. Thus, the chosen adjusted model is not necessarily a best fitting model, but rather is a compromise between a best fitting model and a stable model. Preferably, the chosen model is the adjusted candidate which has the lowest error criterion value among those adjusted candidates which are relatively stable, i.e., have a stability value beneath a predetermined level. In a preferred embodiment of the present invention, the stability value comprises the maximum of the standard error deviations of the parameters of the models, as described above, and the predetermined allowed level is between 2 and 6 most preferably, 4. Thus, the chosen adjusted model does not include a parameter which received a value with a very high diversity of data. Such diversity of data indicates that the fit is most probably due to fluctuations and/or errors in the measurements and has no physical meaning. It is noted that a non-stable adjusted model usually receives a stability value much higher than this threshold.

Filter 42 is preferably as described in the above mentioned paper by Yuval Zur and Saul Stoker MRM 1996. The parameters of filter 42, i.e., amplitudes $\alpha_j$ and frequencies $\overline{\omega}_j$ are set (78) responsive to the chosen model. The parameters of filter 42 are preferably calculated in the Laplace domain according to:

$$1 + \sum_{j=1}^{N} \frac{\alpha_j s}{s + \overline{\omega}_j} = \frac{1}{1 - \sum_{j=1}^{N} \frac{\beta_j s}{s + \omega_j}} \qquad (3)$$

Amplitudes $\alpha_j$ and frequencies $\overline{\omega}_j$ are preferably determined from equation (3) using any suitable algebraic method. A suitable exemplary method is described, for example, in Morich M. et al., "Exact Temporal Eddy Current Compensation in Magnetic Resonance Imaging Systems" IEEE transactions on medical imaging, vol. 7, September 1988, the disclosure of which is incorporated herein by reference.

In a preferred embodiment of the present invention, filters 42 and/or filters 38 and 54 are implemented using a gradient controller board which allows implementation of up to four exponentials with respective ranges of allowed time constants. An exemplary list of the allowed ranges of the four exponential elements in a gradient controller board known in the art is described in table 1.

TABLE 1

| Range | From (msec) | To (msec) |
|---|---|---|
| 1) | 1 | 10.32 |
| 2) | 10 | 103.2 |
| 3) | 33 | 340.6 |
| 4) | 100 | 1032 |

As may be seen from table 1, the gradient controller board cannot implement a candidate model which has two exponential terms which have time constants within a single range. Therefore, candidate models which have two exponential terms in the same range are not selected to be the chosen model. Alternatively or additionally, the parameters of the candidate model are re-adjusted so that the candidate may be implemented using the gradient controller board.

In a preferred embodiment of the present invention, in performing the exponential fit of a candidate model, the ranges of possible time-constants are taken into account in setting the parameters. If, for example, during the exponential fit a time constant has a value beneath the lowest possible value in the range, e.g., below 1 msec, the time constant is fixed at the lowest possible value of the range, e.g., at 1 msec. The rest of the exponential fit is performed with the fixed time constant having the fixed value. If the altered candidate is still a better fit than the other candidates, it may be chosen.

In preferred embodiments the above described filter setting reduces the eddy fields by a factor of between 10–20. However, in many cases it is desired to reduce the eddy fields by a factor of up to about 5000 and even more. Therefore, after setting the parameters of filter 42 the residual eddy field dB(t) is preferably measured (80). The parameters of filter 42 are corrected in order to compensate for the measured residual eddy field. Preferably, differentials $d\alpha_j$ and $d\overline{\omega}_j$ which represent required changes in the amplitudes $\alpha_j$ and the frequencies $\overline{\omega}_j$ of filter 42, are calculated responsive to the residual field dB(t). Differentials $d\alpha_j$ and $d\overline{\omega}_j$ are preferably calculated by fitting (86) the measurements of the residual field dB(t) into a model of the residual field which is a linear combination of differentials $d\alpha_j$ and $d\overline{\omega}_j$. The use of a model which is a linear combination of the differentials allows fast and accurate fitting of the measurements to the model, using standard or non-standard linear fitting methods.

In a preferred embodiment of the present invention, the residual field is modeled by:

$$df(t) = \sum_{j=1}^{N} U_j d\alpha_j + \sum_{j=1}^{N} V_j d\overline{\omega}_j \qquad (4)$$

in which:

$$V_j = \sum_{k=1}^{N} B_{jk} e^{-\overline{\omega}_j t}[1 - e^{-\overline{\omega}_j T}] +$$

$$\sum_{k=1}^{N} B_{jk} e^{-\omega_k t}[1 - e^{-\omega_k T}] + tc_j e^{-\overline{\omega}_j t}[1 - e^{-\overline{\omega}_j T}] - Tc_j e^{-\overline{\omega}_j(t+T)}$$

$$U_j = \sum_{k=1}^{N} A_{jk} e^{-\omega_k t}[1 - e^{-\omega_k T}] + d_j e^{-\overline{\omega}_j t}[1 - e^{-\overline{\omega}_j T}]$$

$$A_{jk} = \frac{\beta_k \omega_k}{\varpi_j - \omega_k}; B_{jk} = \frac{\alpha_j \beta_k \omega_k}{(\varpi_j - \omega_k)^2}; d_j = 1 - \sum_{k=1}^{N} \frac{\beta_k \varpi_j}{\varpi_j - \omega_k}; c_j = -\alpha_j d_j$$

The measurements of the residue field dB(t) are preferably fit to the model using a stable linear fit method, such as the method described hereinbelow with reference to FIG. 4. Alternatively, any other stable linear fit method may be used, such as the Singular Value Decomposition (SVD) method. Further alternatively, a standard linear fit method is used, for example, as described in chapter 15 of the above referenced book "Numerical Recipes in C".

The resulting differentials $d\alpha_j$ and $d\overline{\omega}_j$ from fitting the measurements of the residue field dB(t) to the model are preferably added respectively to the amplitudes $\alpha_j$ and the frequencies $\overline{\omega}_j$. The new amplitudes $\alpha_j$ and frequencies $\overline{\omega}_j$ are set in filter 42 (82). Preferably, the steps of measuring the residual eddy field (80), fitting (86) the measured field to the residue model and correcting filter 42 (82) are repeated (84) until the measurements of the field are beneath a predetermined level, preferably beneath the noise level of assembly 20.

Alternatively or additionally to using a residue model which depends on differentials of the filter parameters (e.g., equation (4)), the residue model depends on differentials of the model parameters $d\beta_j$ and/or $d\omega_j$. The measurements of the residue field are fitted into the residue model and accordingly the differentials are determined. The determined differentials are added to their respective parameters and new filter parameters are determined therefrom using equation (3).

Figure 4:
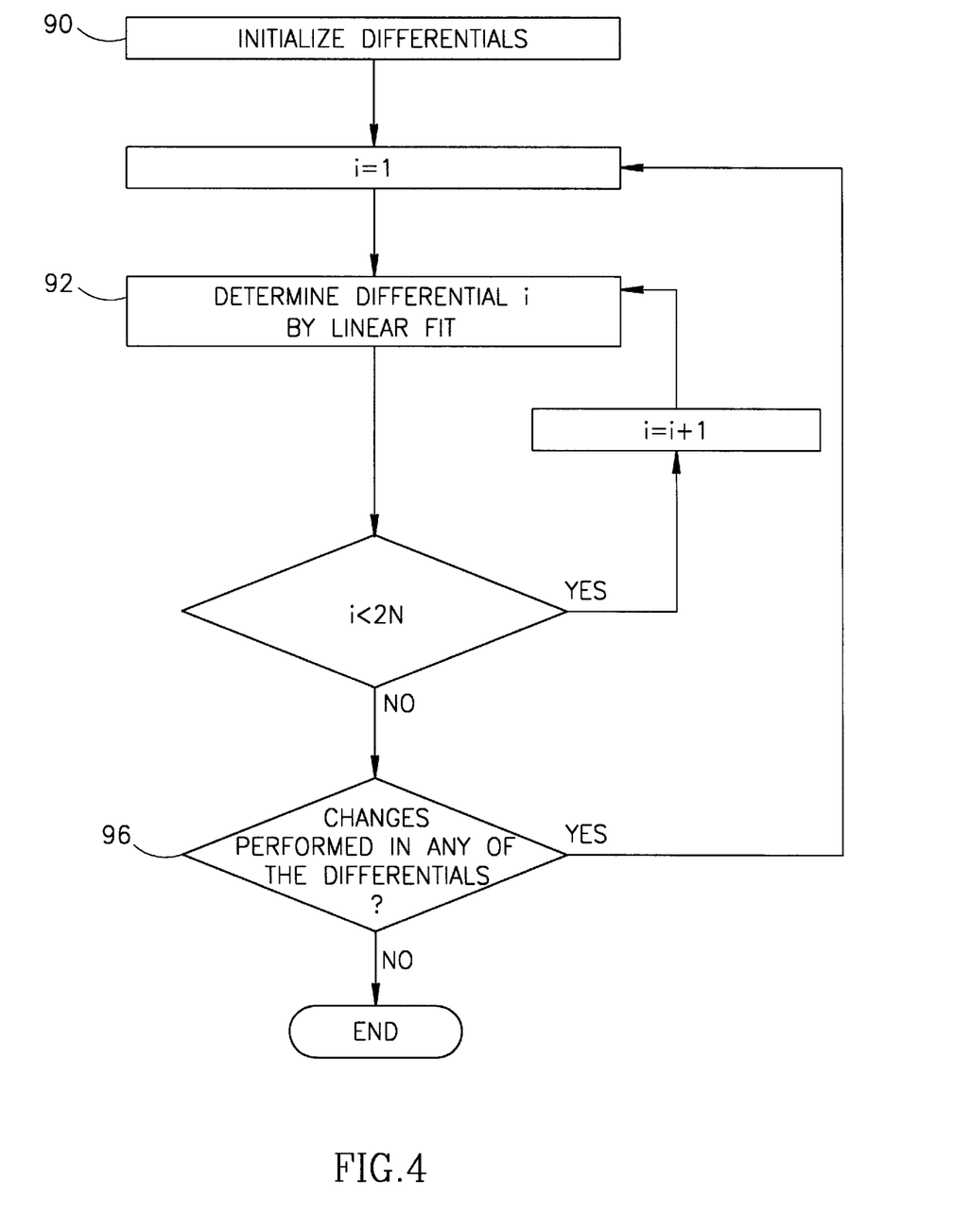
FIG. 4 is a flow chart illustrating a linear fit method, in accordance with a preferred embodiment of the present invention.

FIG. 4 is a flow chart illustrating a linear fit method for fitting the measured residue field into the residue model (86, FIG. 3), in accordance with a preferred embodiment of the present invention. Differentials $d\alpha_j$ and $d\overline{\omega}_j$ are preferably set in equation (4) in a manner which minimizes an error criterion, such as the criterion of equation (2). However, rather than finding a combination of values of the differentials which minimizes the error criterion, the differentials are adjusted separately so as to stabilize the fitting method. It is noted that during the entire fitting method of FIG. 4, the actual values of the parameters in the filter remain unchanged. Only after the method of FIG. 4 is completed are the parameters in the filter changed as indicated by step 82 in FIG. 3.

Preferably, the differentials are first initialized (90) to zero. An adjustment stage is then preferably performed separately for each of the differentials in equation (4). In FIG. 4 the differentials are referred to by an index i which ranges between 1 and 2N (N being the number of exponential terms in the chosen model). The value of each differential i is set (92) so as to minimize the error criterion for equation (4), while the differentials of the rest of the parameters are held fixed at their previous values. Step 92 is preferably repeated for each of the differentials i in equation (4) a plurality of times. Preferably, step 92 is repeated for a specific differential i only after step 92 was performed for substantially all the other differentials.

Preferably, step 92 is repeated until (96) no improvement is achieved in the error criterion by additional adjustments. Alternatively, the process is repeated until the improvement in the error criterion is marginal. Further alternatively, the process is repeated for a predetermined number of times, preferably between about 15 and 20 times.

Preferably, the values in equation (4) of the filter parameters $\alpha_j$ and $\overline{\omega}_j$ are kept at their initial values from equation (3) during the entire linear fit method of FIG. 4. Alternatively, each time a differential is set (92), the value used in equation (4) for the respective parameter of differential i, is preferably immediately adjusted according to the newly set value of the differential i. Preferably in this alternative, the differential i is added to the initial value of its respective parameter as it was determined from equation (3).

Alternatively, the values of filter parameters $\alpha_j$ and $\overline{\omega}_j$ are adjusted once in every round of setting all the differentials. In some preferred embodiments of the present invention, the values of model parameters $\beta_j$ and $\omega_j$ in equation (4) remain constant during the entire linear fit of FIG. 4. The changes in the filter parameters compensate in these embodiments for errors in the model parameters, and thus there is no need to perform mathematical inversions which are in many cases error prone. Alternatively, each time changes are made to the values of any of filter parameters $\alpha_j$ and $\overline{\omega}_j$, the values of model parameters $\beta_j$ and $\omega_j$ in equation (4) are adjusted according to equation (3).

It is noted that during the linear fit a differential of a time constant of one of the exponential terms of the model may receive a value which moves the time constant out of its range in the gradient controller board. If the range to which it is to move is used for a different exponential term, or the time constant is to pass the lowest or highest time constant allowed by the gradient controller board, the differential of the time constant is fixed at the value which corresponds to the lowest or highest value of the time constant in its present range. Alternatively or additionally, the time constants of the model are otherwise arranged in the gradient controller board to allow implementation of the model by the board.

Alternatively to setting each of the differentials separately, the setting is performed together for groups of differentials which appear in the model with the same sign. Further alternatively, the setting is performed in groups in accordance with any other suitable grouping of the differentials. Such grouping preferably does not include in a single group, differentials which with their terms could substantially cancel each other and thus cause the model to be unstable.

Reference is made back to FIG. 3 to describe the actions performed in setting the parameters of a filter 38 which eliminates non-diagonal eddy fields, for example y to x filter 38'. A long unit demand of a time period T is provided through the y-demand and the field generated in the x-direction responsive thereto is measured as a function of time. The measurements are preferably taken and normalized as described above with reference to FIG. 3, providing the eddy field in the x-direction responsive to the y-demand, B(t). Using an exponential fitting method as described above, the eddy field B(t) is modeled by a sum of exponents as described by equation (1).

Filters 38 are preferably internally substantially identical to filters 42. However, unlike filter 42 which compensates for diagonal fields leaving the desired fields, filter 38 compensates for non-diagonal fields by simply canceling the measured eddy fields. Therefore, the amplitudes $\alpha_j$ and frequencies $\overline{\omega}_j$ of filter 38 are preferably equal respectively to the amplitudes $\beta_j$ and the frequencies $\omega_j$ from the model of the eddy field.

After setting the parameters of filter 38, the residual eddy field dB(t) is preferably measured. The differentials $d\alpha_j$ and $d\overline{\omega}_j$ for the amplitudes $\alpha_j$ and the frequencies $\overline{\omega}_j$ of filter 38 are calculated responsive to the residual field dB(t). The residual field is preferably modeled by:

$$df(t) = \sum_{j=1}^{N} A_j d\alpha_j - \left[ t \sum_{j=1}^{N} \alpha_j A_j - T \sum_{j=1}^{N} \alpha_j e^{-\varpi_j(t+T)} \right] d\varpi_j \qquad (5)$$

in which:

$$A_j = e^{-\varpi_j t}[1 - e^{-\varpi_j T}]$$

The differentials $d\alpha_j$ and $d\varpi_j$ are preferably set as described above with reference to FIG. 4, or using a standard linear fit method. The amplitudes $\alpha_j$ and the frequencies $\varpi_j$ are preferably adjusted and the steps of measuring the residual eddy field (80), fitting the measured field to the residue model and correcting filter 38 (82) are repeated (84) as described above.

Equations (4) and (5) have been developed by forming an equation which correlates between the residual field and a required change ($\Delta A$) in the transfer function of the compensation filter. The required change is correlated with the differentials of the parameters by taking the partial derivatives of the transfer function of the filter. The calculations in deriving equations (4) and (5) are preferably performed without performing simplifications and/or neglecting elements. For example, the unstable assumption that:

$$\sum_{j=1}^{N} \frac{\alpha_j \omega_k}{\varpi_j - \omega_k} = 1$$

used in the above mentioned paper by Yuval Zur and Saul Stoker, MRM, 1996, is not used in deriving equations (4) and (5). Thus, it is noted that both equations (4) and (5) are sums of terms, in which some of the terms include two instances of a variable which represents the measurement time of the measured fields. In fact, these terms are linearly dependent on the variable which represents the measurement time. Furthermore, equation (4) includes for each combination of a filter parameter and a model parameter, more than ten exponential functions and more than twelve references to model or filter parameters.

It is noted that a single magnet assembly may include fewer or more coils than described above, and these coils may be compensated for in a manner similar to that described above. In some preferred embodiments of the present invention, a separate filter may be used to symmetrize the eddy current fields in the coils to allow better eddy field compensation. The setting of the parameters of such a symmetrization filter may also be performed in a manner similar to that described above.

Furthermore, more than one set of eddy fields may appear in a single coil, and each of the sets of eddy fields may be compensated separately in a manner similar to that described above. Specifically, in some systems the generated eddy fields include short period fields which decay in less than 1 ms, and long period fields which decay after at least 10 ms. Preferably, the short period eddy fields are first measured and compensated, as described above, and afterwards the long period eddy fields are measured and compensated. Alternatively, the compensation may be performed in a reverse order. Alternatively or additionally, the diagonal and non diagonal terms of the various period eddy fields of the various coils of a coil assembly are compensated in any suitable order, sequentially or interchangeably.

In a preferred embodiment of the present invention, the short period eddy fields are measured by acquiring data from two or three consecutive slices of a phantom. The acquired data from the consecutive slices is fit to a straight line based on the phase differences between the slices to receive the measurements of the eddy field. Preferably, in measuring short eddy fields, for example in the z direction, only z encoding is used in acquiring the data and no encoding is used in the x and y directions. The long period eddy fields are preferably measured as described in "New Efficient Eddy-Field-Mapping Procedure (FAME)" by J. Schiff et al., Journal of Magnetic resonance, Series B 104, 73–76, 1994, the disclosure of which is incorporated herein by reference.

It will be appreciated that the above described methods may be varied in many ways, including, changing the order of steps and the exact implementation used, which can include matrix arithmetic or which may perform the same arithmetic using other methods. It should also be appreciated that although the preferred embodiments were described only as methods, apparatus for carrying out the methods are within the scope of the invention.

It is noted that the above described embodiments are given by way of example only, and the scope of the invention is limited only by the claims. When used in the following claims, the terms "comprises", "include", "have" and their conjugates mean "including but not limited to".

What is claimed is:

1. A method of compensating for an eddy field according to measurements of the field, comprising:
   fitting the measurements of the field to a plurality of candidate models of the field;
   assigning a stability value indicative of the stability of the fitted model to changes, to each of the fitted candidate models;
   selecting a model from the candidate models responsive to the stability values of the candidate models; and
   compensating for the eddy field responsive to the selected model.

2. A method according to claim 1, comprising determining for each of the candidate models an error criterion representative of a similarity between the fitted candidate model and the measurements of the eddy field, and wherein selecting the model comprises selecting the model responsive to the error criterions of the candidate models.

3. A method according to claim 2, wherein selecting the model comprises selecting from those candidate models which have a stability value which adheres to a predetermined rule.

4. A method according to claim 3, wherein selecting the model comprises selecting from those candidate models which have a stability value below a predetermined value.

5. A method according to claim 3, wherein selecting the model comprises selecting the candidate model with a lowest error criterion from those candidate models which have a stability value which adheres to the predetermined rule.

6. A method according to claim 1, wherein fitting the measurements of the field comprises fitting the field to a plurality of sums of exponentials with different numbers of exponential elements.

7. A method according to claim 6, wherein fitting the measurements of the field comprises fitting the field to sums of exponentials having up to three exponential elements.

8. A method according to claim 1, wherein fitting the measurements of the field comprises setting parameters of the candidate models so as to minimize an error criterion representative of the difference between the candidate model and the measurements of the field.

9. A method according to claim 1, wherein assigning the stability value comprises assigning a value which is a function of an uncertainty in a value of at least one parameter of the model.

10. A method according to claim 1, wherein assigning the stability value comprises assigning a value which is a function of a standard deviation of an error in at least one parameter of the model.

11. A method according to claim 1, wherein compensating for the eddy field comprises setting parameters of at least one filter for eddy field compensation.

12. A method according to claim 11, comprising:

measuring a residue eddy field while compensating for the eddy field;

fitting the measurements of the residue field to a residue-model of the residue field, the residue-model being a linear function of differentials related to the filter parameters; and resetting the filter parameters responsive to the fitting of the measurements.

13. A method of correcting the values of filter parameters of an eddy field compensation filter, comprising:

measuring a residue eddy field, the measurements including values of the field and times at which the values were measured;

fitting the measurements of the residue field to a model of the residue field, the residue-model being a linear function of differentials related to the filter parameters, wherein the residue-model includes at least one term linearly dependent on a time variable representing the measurement time; and correcting the values of the filter parameters responsive to the values of the differentials from the fitting.

14. A method according to claim 13, wherein the model of the residue field is a function of the filter parameters and of a plurality of model parameters.

15. A method according to claim 14, wherein the model of the residue field comprises at least six exponential terms for each possible combination of a model parameter and a filter parameter.

16. A method according to claim 14, wherein the model of the residue field comprises at least fifteen references to model or filter parameters for each possible combination of a model parameter and a filter parameter.

17. A method according to claim 14, wherein the model of the residue field comprises for each possible combination of a model parameter and a filter parameter at least three terms which are functions of a time variable representative of the measurement time.

18. A method according to claim 13, wherein the model of the residue field comprises a sum of terms, at least one of the terms being linearly dependent on a time variable representative of the measurement time.

19. A method according to claim 18, wherein at least one of the terms of the model is dependent on a product of the time variable and an exponential of the time variable.

20. A method according to claim 13, wherein the differentials related to the filter parameters comprise for substantially each filter parameter a respective differential.

21. A method according to claim 13, wherein correcting the values of the filter parameters comprises adding the differentials to respective filter parameters.

22. A method according to claim 13, wherein correcting the values of the filter parameters comprises adding the differentials to respective model parameters and calculating new filter parameters from the model parameters.

23. A method according to claim 13, wherein the residue eddy field comprises a diagonal eddy field.

24. A method according to claim 13, wherein the residue eddy field comprises a non-diagonal eddy field.

25. A method according to claim 13, wherein fitting the measurements to the residue model comprises performing a plurality of adjustment steps in which the measurements are fit to the residue-model by adjusting the values of fewer than all the adjustment parameters.

26. A method of adjusting filter parameters of an eddy field compensation filter, comprising:

measuring a residue eddy field;

providing a residue-model for the measurements of the residue field, the residue model being a linear function of a plurality of adjustment parameters;

performing a plurality of adjustment steps in which the measurements of the residue-field is fit to the residue-model by adjusting the values of fewer than all the adjustment parameters; and adjusting the filter parameters in the compensation filter responsive to the adjustment parameters.

27. A method according to claim 26, wherein the adjustment parameters comprise differentials to be added to the filter parameters.

28. A method according to claim 26, wherein performing the plurality of adjustment steps comprises performing steps in which only one of the adjustment parameters is adjusted.

29. A method according to claim 26, wherein performing the adjustment steps comprises performing steps in which in each single step only adjustment parameters which appear in the residue-model with the same sign are adjusted.

30. A method according to claim 26, wherein the residue model is a function of at least one of the filter parameters.

31. A method according to claim 30, comprising changing the value in the residue model of at least one of the filter parameters, after at least one of the adjustment steps.

32. A method according to claim 31, comprising changing the value in the residue model of at least one of the filter parameters, between each two adjustment steps.

33. A method according to claim 31, wherein the residue model is a function of at least one model parameter of a model used to determine the filter parameters before the adjustment, and wherein the value of the model parameter remains constant during the performing of the plurality of adjustment steps.

* * * * *